(12) United States Patent
Towle et al.

(10) Patent No.: US 6,489,185 B1
(45) Date of Patent: Dec. 3, 2002

(54) PROTECTIVE FILM FOR THE FABRICATION OF DIRECT BUILD-UP LAYERS ON AN ENCAPSULATED DIE PACKAGE

(75) Inventors: Steven Towle, Sunnyvale, CA (US); Paul Koning, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/660,755

(22) Filed: Sep. 13, 2000

(51) Int. Cl.[7] .............................................. H01L 21/50
(52) U.S. Cl. ...................... 438/127; 251/679; 251/693; 251/738; 174/52.1; 174/52.2; 174/52.3; 174/52.4; 438/106
(58) Field of Search ......................... 438/127; 174/52.3, 174/52.4, 52.1, 52.2; 361/813; 257/679, 693, 738

(56) References Cited

U.S. PATENT DOCUMENTS

| 5,353,498 A | 10/1994 | Fillion et al. |
| 5,422,513 A | 6/1995 | Marcinkiewicz et al. |
| 5,497,033 A | 3/1996 | Fillion et al. |
| 5,527,741 A | 6/1996 | Cole et al. |
| 5,703,400 A | 12/1997 | Wojnarowski et al. |
| 5,745,984 A | 5/1998 | Cole, Jr. et al. |
| 6,271,469 B1 * | 8/2001 | Ma et al. ................. 174/52.4 |

FOREIGN PATENT DOCUMENTS

JP          11312868        11/1999

* cited by examiner

Primary Examiner—David Nelms
Assistant Examiner—Reneé R. Berry
(74) Attorney, Agent, or Firm—Schwegmann, Lundberg, Woessner & Kluth, P.A.

(57) ABSTRACT

A present invention includes a packaging technology that fabricates build-up layers on an encapsulated microelectronic die that has expanded area larger than that of the microelectronic die. An active surface of a microelectronic die is attached by an adhesive material to a protective film sheet to protect the active surface and to control the position of the microelectronic die during an encapsulation process. The protective film sheet has adhesive material substantially only in an area where the microelectronic die and/or a microelectronic package core are attached, or has the adhesive properties of the adhesive material diminished or eliminated in areas where an encapsulation material will be applied.

24 Claims, 30 Drawing Sheets

PROTECTIVE FILM FOR THE FABRICATION OF DIRECT BUILD-UP LAYERS ON AN ENCAPSULATED DIE PACKAGE

BACKGROUND OF THE INVENTION

1. Field of the Invention

The present invention relates to apparatus and processes for packaging microelectronic dice. In particular, the present invention relates to a protective film using in a packaging technology that fabricates build-up layers on a microelectronic die and on encapsulation material that abuts the microelectronic die.

2. State of the Art

Higher performance, lower cost, increased miniaturization of integrated circuit components, and greater packaging density of integrated circuits are ongoing goals of the computer industry. As these goals are achieved, microelectronic dice become smaller. Of course, the goal of greater packaging density requires that the entire microelectronic die package be equal to or only slightly larger (about 10% to 30%) than the size of the microelectronic die itself. Such microelectronic die packaging is called a "chip scale packaging" or "CSP".

As shown in FIG. 26, true. CSP would involve fabricating build-up layers directly on an active surface 204 of a microelectronic die 202. The build-up layers may include a dielectric layer 206 disposed on the microelectronic die active surface 204. Conductive traces 208 may be formed on the dielectric layer 206, wherein a portion of each conductive trace 208 contacts at least one contact 212 on the microelectronic die active surface 204. External contacts, such as solder balls or conductive pins for contact with an external component (not shown), may be fabricated to electrically contact at least one conductive trace 208. FIG. 26 illustrates the external contacts as solder balls 214 which are surrounded by a solder mask material 216 on the dielectric layer 206. However in such true CSP, the surface area provided by the microelectronic die active surface 204 generally does not provide enough surface for all of the external contacts needed to contact the external component (not shown) for certain types of microelectronic dice (e.g., logic).

Additional surface area can be provided through the use of an interposer, such as a substrate (substantially rigid material) or a flex component (substantially flexible material). FIG. 27 illustrates a substrate interposer 222 having a microelectronic die 224 attached to and in electrical contact with a first surface 226 of the substrate interposer 222 through small solder balls 228. The small solder balls 228 extend between contacts 232 on the microelectronic die 224 and conductive traces 234 on the substrate interposer first surface 226. The conductive traces 234 are in discrete electrical contact with bond pads 236 on a second surface 238 of the substrate interposer 222 through vias 242 that extend through the substrate interposer 222. External contacts 244 (shown as solder balls) are formed on the bond pads 236. The external contacts 244 are utilized to achieve electrical communication between the microelectronic die 224 and an external electrical system (not shown).

The use of the substrate interposer 222 requires number of processing steps. These processing steps increase the cost of the package. Additionally, even the use of the small solder balls 228 presents crowding problems which can result in shorting between the small solder balls 228 and can present difficulties in inserting underfilling between the microelectronic die 224 and the substrate interposer 222 to prevent contamination and provide mechanical stability.

FIG. 28 illustrates a flex component interposer 252 wherein an active surface 254 of a microelectronic die 256 is attached to a first surface 258 of the flex component interposer 252 with a layer of adhesive 262. The microelectronic die 256 is encapsulated in an encapsulation material 264. Openings are formed in the flex component interposer 252 by laser abalation through the flex component interposer 252 to contacts 266 on the microelectronic die active surface 254 and to selected metal pads 268 residing within the flex component interposer 252. A conductive material layer is formed over a second surface 272 of the flex component interposer 252 and in the openings. The conductive material layer is patterned with standard photomask/etch processes to form conductive vias 274 and conductive traces 276. External contacts are formed on the conductive traces 276 (shown as solder balls 278 surrounded by a solder mask material 282 proximate the conductive traces 276).

The use of a flex component interposer 252 requires gluing material layers which form the flex component interposer 252 and requires gluing the flex component interposer 252 to the microelectronic die 256. These gluing processes are relatively difficult and increase the cost of the package. Furthermore, the resulting packages has been found to have poor reliability.

Therefore, it would be advantageous to develop new apparatus and techniques to provide additional surface area to form traces for use in CSP applications, which overcomes the above-discussed problems.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE ILLUSTRATED EMBODIMENT

Although FIGS. 1–24 and 25a–c illustrate various views of the present invention, these figures are not meant to portray microelectronic assemblies in precise detail. Rather, these figures illustrate microelectronic assemblies in a manner to more clearly convey the concepts of the present invention. Additionally, elements common between the figures retain the same numeric designation.

The present invention includes a packaging technology that fabricates build-up layers on an encapsulated microelectronic die that has expanded area larger than that of the microelectronic die. An active surface of a microelectronic die is attached by an adhesive material to a protective film sheet to protect the microelectronic die active surface form contamination and surface damage, and to control the positioning of the microelectronic die during an encapsulation process. An encapsulation material is then applied over the protective film sheet.

Figure 1:
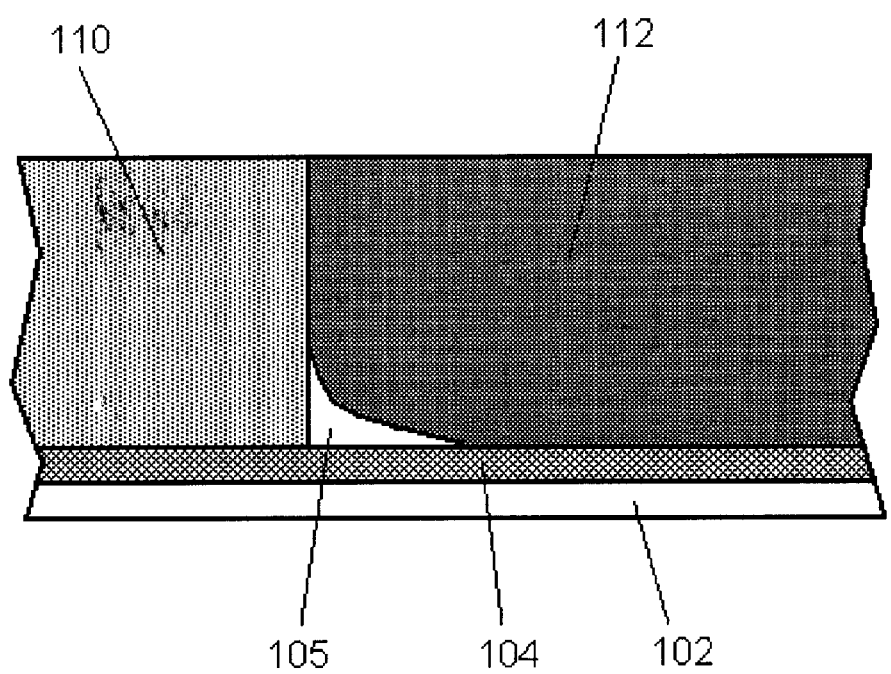
FIG. 1 is an side cross-sectional view demonstrating the voiding problem occurring with the use of an adhesive material.

However, it has been found that it is, in general, difficult to achieve good wetting of the adhesive material by the encapsulation material during the encapsulation process. As illustrated in FIG. 1, poor wetting of an adhesive material 104 can prevent an encapsulation material 112 from filling into the corner 105 between the microelectronic die 110 (and/or a microelectronic package core) and the adhesive material 104/protective film sheet 102, which in turn causes non-planarity of the surface for subsequent build up layers.

By eliminating the adhesive material 104 or diminishing/eliminating the adhesive properties of the adhesive material 104 from areas were the encapsulation material 112 will be applied, this wetting problem can be avoided. Thus, the present invention provides a protective film sheet which has adhesive material patterned substantially only in areas where microelectronic dice and/or a microelectronic package core (if utilized in the microelectronic package) are subsequently attached. The adhesive material protects an active surface of the microelectronic dice and controls the positioning of the microelectronic dice on the protective film. In an alternate embodiment, a release agent may be could be deposited on the adhesive in where the encapsulation material will be applied.

For this to be effective, however, the x–y positioning of the adhesive pattern, the microelectronic dice, and the microelectronic package core all have to be on the same order as the adhesive material thickness, typically 20–75 $\mu$m. Such positional accuracy may be achieved by proper choice of the adhesive patterning, and the microelectronic die and microelectronic package core placement processes, or alternatively by a self-aligned approach.

Once the microelectronic die is encapsulated in an encapsulation material and the protective film is removed. The protective film adhesive should be selected such that encapsulation material does not stick to it during encapsulation process, and such that the encapsulation process or other subsequent processing, does not induce excessive adhesion between the microelectronic die and/or microelectronic package core (if utilized in the microelectronic package). Furthermore, the patterning of the adhesive material to specific areas on the protective film sheet results in easier removal of the protective film sheet. Moreover, it prevents the adhesive material from sticking to the encapsulation material, which can be difficult to remove.

Figure 2:
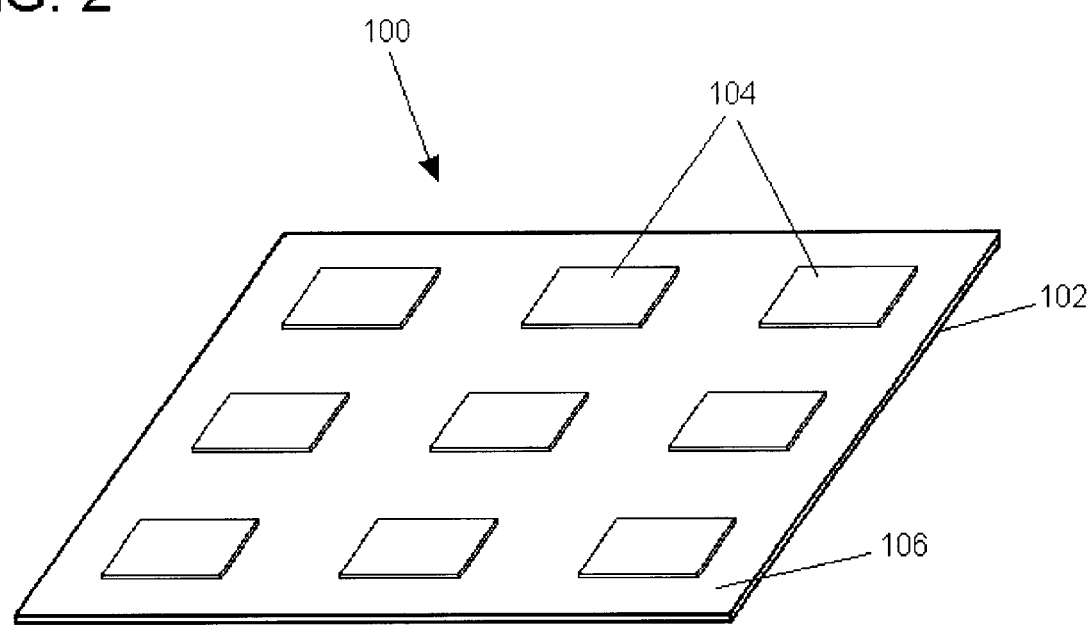
FIG. 2 is an oblique view of a protective film having discrete adhesive areas, according to the present invention.
Figure 3:
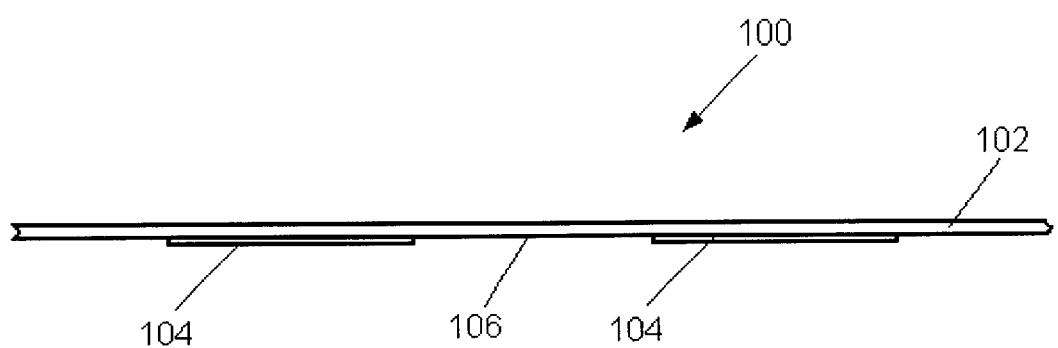
FIG. 3 is a side cross-sectional view of the protective film of FIG. 1, according to the present invention.

FIGS. 2 and 3 illustrate an oblique view and a side cross-section view, respectively, of a protective film 100 of the present invention. The protective film 100 preferably comprises a sheet 102 of substantially flexible material having at least one discrete area of adhesive material 104 disposed on a first surface 106 of the protective film sheet 102. The protective film sheet 102 is selected from materials, which will substantially not adhere or only weakly adhere to an encapsulation material that will be used in later fabrication steps. The protective film sheet 102 is preferably a substantially flexible material, such as Kapton® polyimide film (E. I. du Pont de Nemours and Company, Wilmington, Del.), but may be made of any appropriate material, including metallic films.

The adhesive material areas 104 are preferably formed from a weak, thermally stable adhesive, such as silicone. The adhesive material areas 104 may be patterned using a variety of techniques, including but not limited to, spray-on patterning, screen printing, and the like. It is, of course, understood that the thickness of the protective film sheet 102 and the adhesive material areas 104 is greatly exaggerated in the figures for illustration purposes. Preferably, the protective film sheet 102 and the adhesive material 104 have substantially similar thickness of between about 20 and 75 $\mu$m each.

Figure 4:
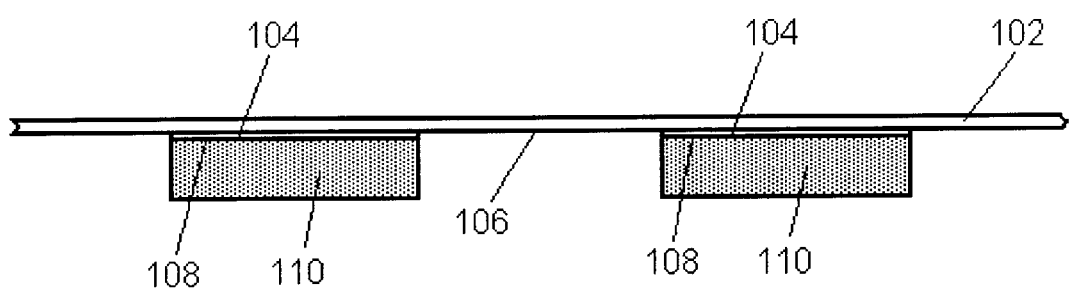
FIG. 4 is a side cross-sectional view of the protective film of FIG. 3 having microelectronic dice attached thereto, according to the present invention.
Figure 5:
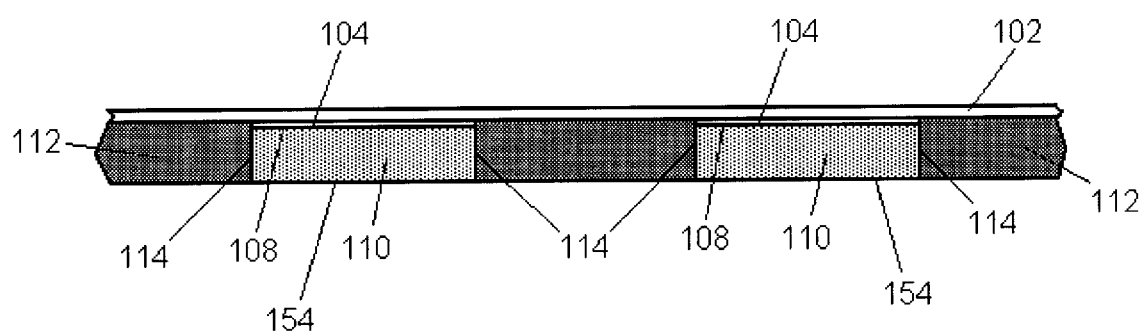
FIG. 5 is a side cross-sectional view of the microelectronic dice of FIG. 4 encapsulated in an encapsulation material, according to the present invention.

As shown in FIG. 4, each adhesive material area 104 preferably substantially corresponds in size (i.e., surface area shape) to an active surface 108 of a corresponding microelectronic die 110 and is abutted thereto to protect the microelectronic die active surface 108 from any contaminants. The microelectronic die 110 is then encapsulated or partially encapsulated with an encapsulation material 112, such as plastics, resins, and the like, as shown in FIG. 5, that at least abuts a side(s) 114 of the microelectronic die 110. The encapsulation of the microelectronic die 110 may be achieved by any known process, including but not limited to transfer and compression molding, and dispensing. The encapsulation material 112 provides mechanical rigidity and provides surface area for subsequent build-up of dielectric and conductive trace layers. Although FIG. 5 depicts a back surface 154 of the microelectronic die 110 exposed for potential subsequent attachment of a heat sink, it is, of course, understood that the microelectronic die back side 154 can be encapsulated.

Figure 6:
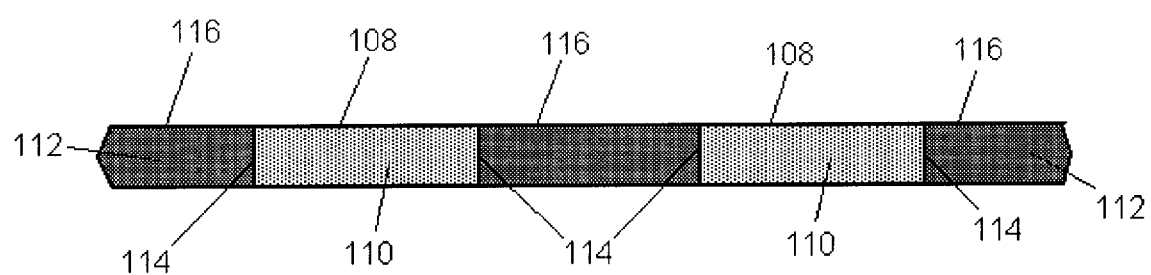
FIG. 6 is a side cross-sectional view of the encapsulated microelectronic dice of FIG. 5 with the protective film removed, according to the present invention.

After encapsulation, the protective film 100 is removed, as shown in FIG. 6, to expose the microelectronic die active surface 108. The removal of the protective film 100 may be facilitated by having an portion of the protective film sheet 102 outside the perimeter of the overall workpiece, wherein an automated removal apparatus could grip the portion of the protective film sheet 102 and remove the protective film 100.

As also shown in FIG. 6, the encapsulation material 112 is preferably molded to form at least one surface 116 which is substantially planar to the microelectronic die active surface 108. The encapsulation material surface 116 will be utilized in further fabrication steps as additional surface area for the formation of build-up layers, such as dielectric material layers and conductive traces.

Figure 7:
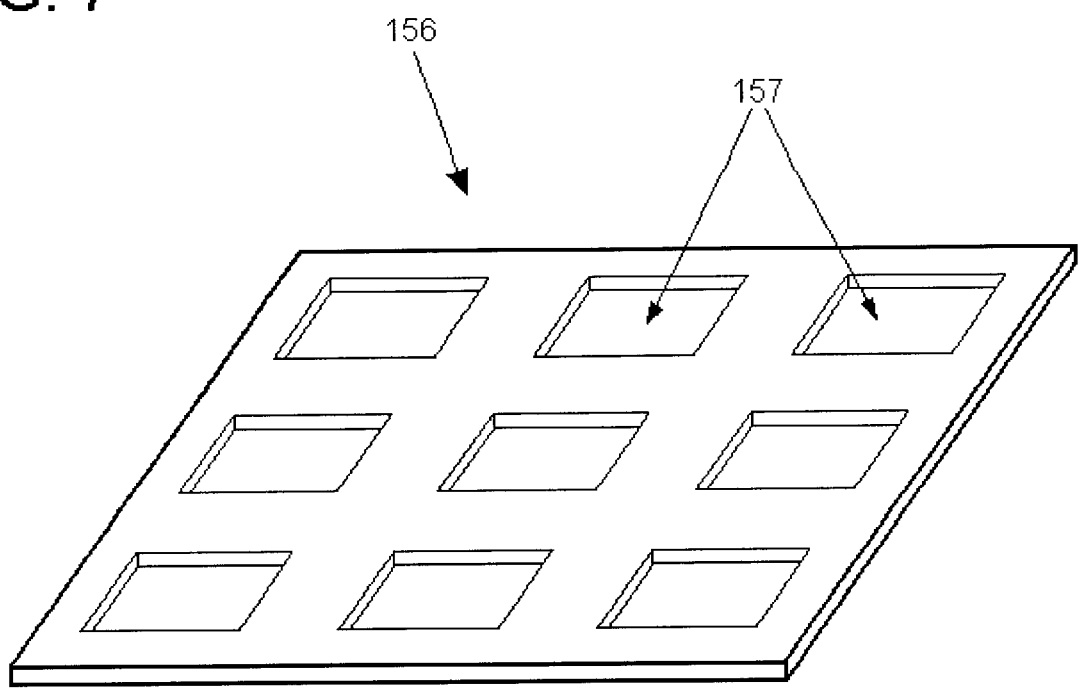
FIG. 7 is an oblique view of a microelectronic package core, according to the present invention.
Figure 8:
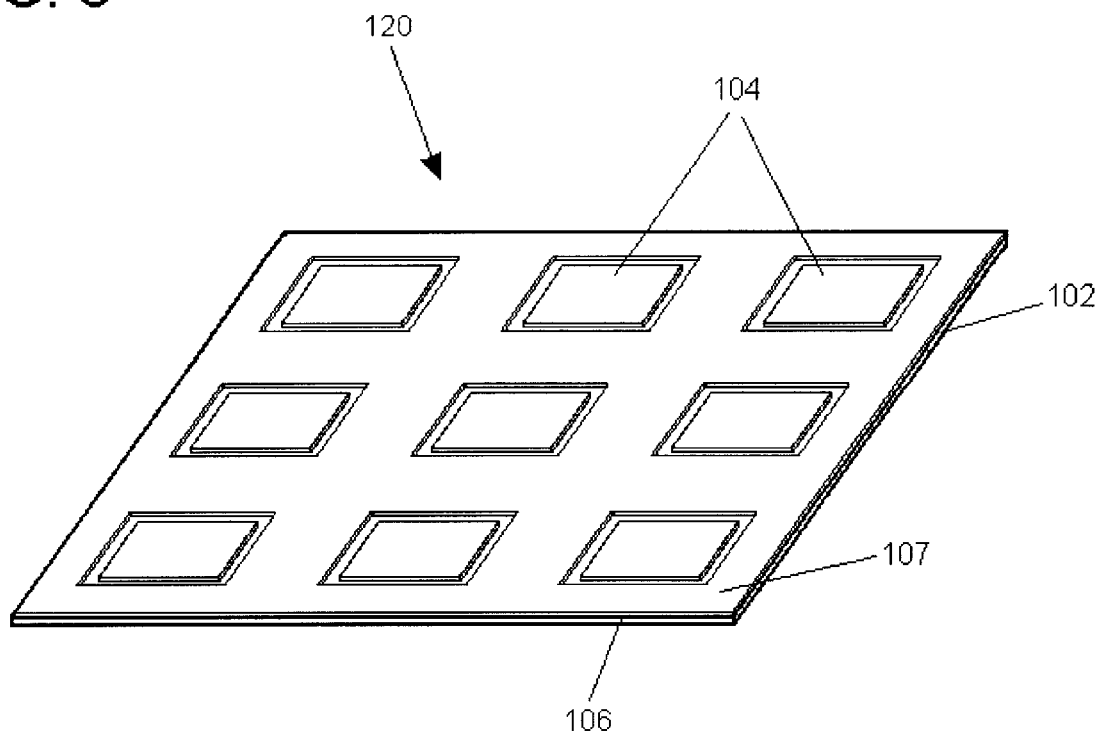
FIG. 8 is an oblique view of a protective film having discrete adhesive for adhering microelectronic dice and a patterned area for adhering a microelectronic package core, according to the present invention.

An alternate embodiment utilizes a microelectronic package core 156 having at least one opening 157, as shown in FIG. 7. Other such structural elements may also be included in the process without departing from the scope of the present invention. The microelectronic package core 156 may be fabricated form bismaleimine triazine resin based materials, FR4-type material, various polyimide materials, ceramic materials, metallic materials (such as copper), and the like. As shown in FIG. 8, a protective film 120 is provided comprising a protective film sheet 102 having at least one discrete area of adhesive material 104 to adhere to a microelectronic die 110 and a patterned area 107 of adhesive to adhere to the microelectronic package core 156.

Figure 9:
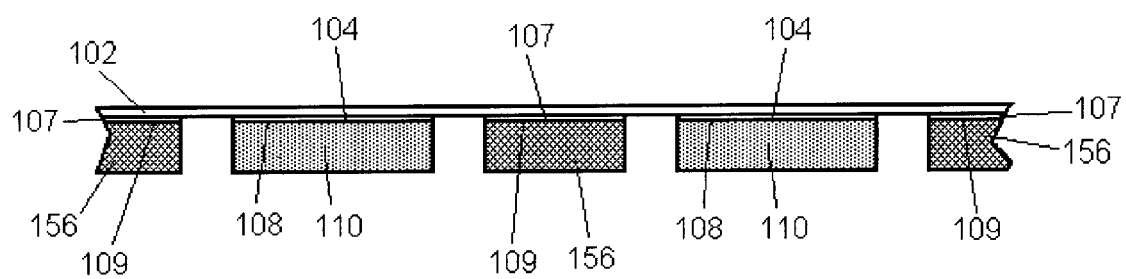
FIG. 9 is a side cross-sectional view of the protective film of FIG. 8 having microelectronic dice and a microelectronic package core attached thereto, according to the present invention.
Figure 10:
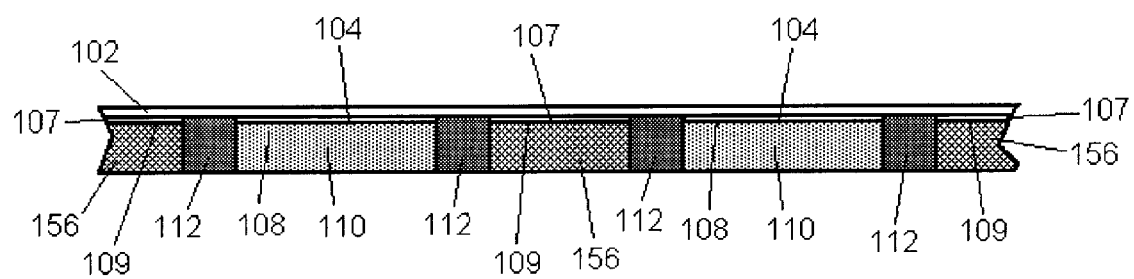
FIG. 10 is a side cross-sectional view of the microelectronic dice and the microelectronic package core of FIG. 9 encapsulated in an encapsulation material, according to the present invention.
Figure 11:
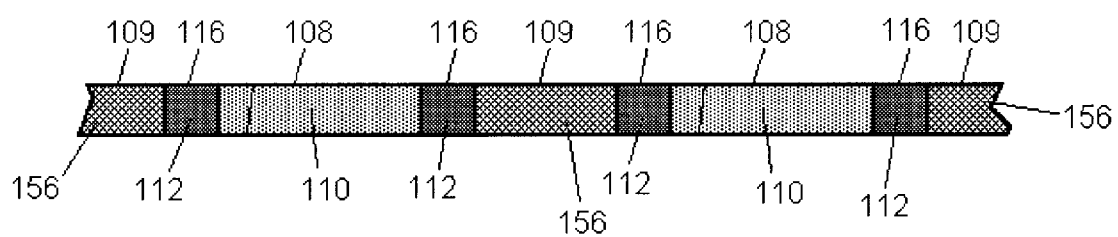
FIG. 11 is a side cross-sectional view of the encapsulated microelectronic dice and microelectronic package core of FIG. 10 with the protective film removed, according to the present invention.

As shown in FIG. 9, the microelectronic package core 156 is abutted against the patterned adhesive material 107 and the microelectronic dice 110 are abutted against the adhesive material area 104 prior to encapsulating. The microelectronic die 110 and microelectronic package core 156 are then encapsulated or partially encapsulated with an encapsulation material 112, as shown in FIG. 10, that at least fills any gaps between the microelectronic package core 156 and the microelectronic die 110. After encapsulation, the protective film 120 is removed, as shown in FIG. 11, to expose the microelectronic die active surface 108, the encapsulation material surface 116, and microelectronic package core surfaces 109. The encapsulation material surfaces 116 and the microelectronic package core surfaces 109 are preferably substantially planar with the microelectronic die active surfaces 108 and will be utilized in further fabrication steps as additional surface area for the formation of build-up layers.

Figure 12:
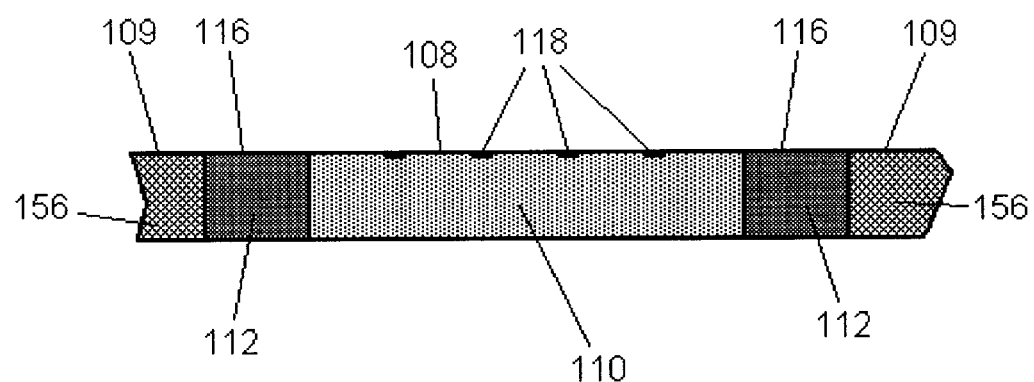
FIGS. 12–20 are side cross-sectional views of a method for forming build-up layers on a single encapsulated die, according to the present invention.
Figure 13:
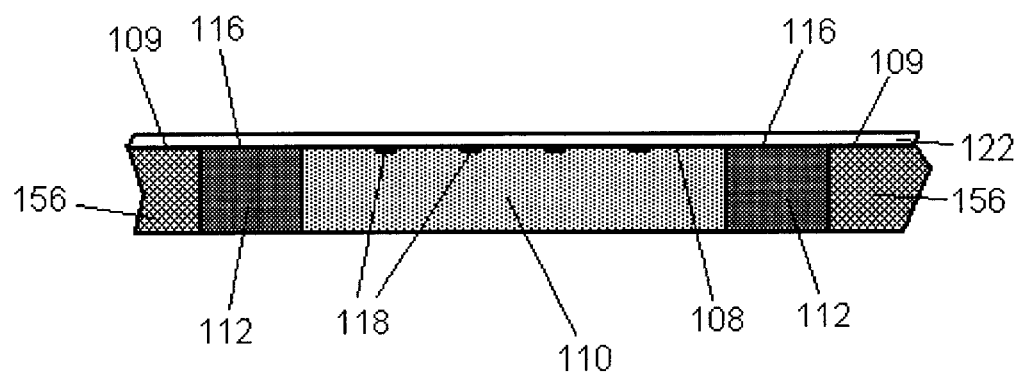

As shown in FIG. 12, the microelectronic die active surface 108 has at least one contact 118 disposed thereon. The contacts 118 are in electrical contact with integrated circuitry (not shown) within the microelectronic die 110. A first dielectric layer 122, such as an epoxy resin, polyimide, bisbenzocyclobutene, and the like, is disposed over the microelectronic die active surface 108, the contacts 118, the encapsulation material surface 116, and the microelectronic package core surface 109, as shown in FIG. 13. It is, of course, understood that the microelectronic package core 156 is optional.

The dielectric layers of the present invention are preferably filled epoxy resins available from Ibiden U.S.A. Corp., Santa Clara, Calif., U.S.A. and from Ajinomoto U.S.A., Inc., Paramus, N.J., U.S.A. The formation of the first dielectric layer 122 may be achieved by any known process, including but not limited to lamination, spin coating, roll coating, and spray-on deposition.

Figure 14:
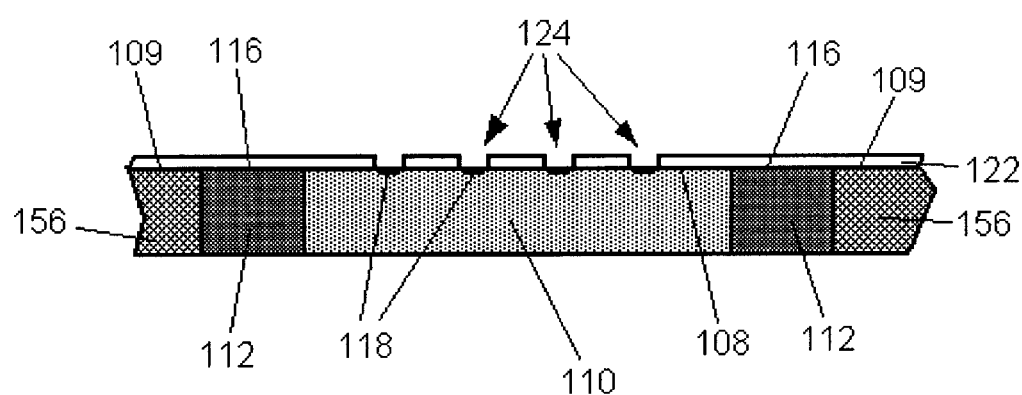

As shown in FIG. 14, a plurality of vias 124 are then formed through the first dielectric layer 122. The plurality of vias 124 may be formed by any method known in the art, including but not limited to laser drilling, photolithography, and, if the first dielectric layer 122 is photoactive, forming the plurality of vias 124 in the same manner that a photoresist mask is made in a photolithographic process, as known in the art.

Figure 15:
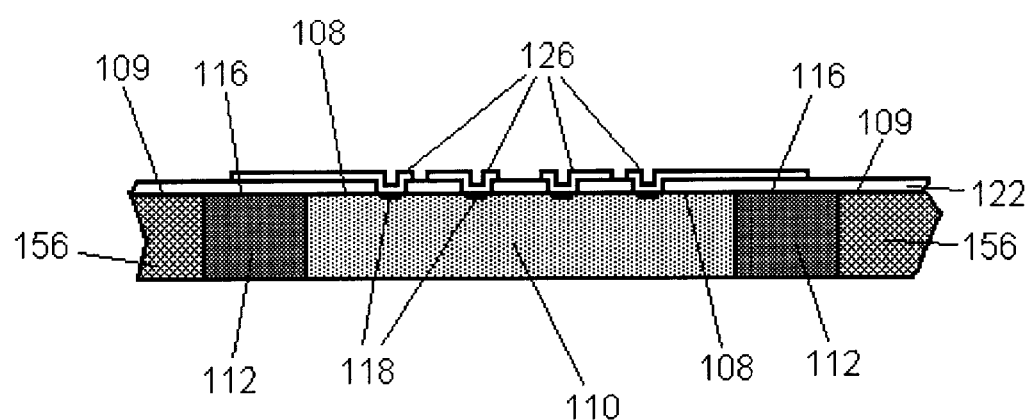

A plurality of conductive traces 126 is formed on the first dielectric layer 122, as shown in FIG. 15, wherein a portion of each of the plurality of conductive traces 126 extends into at least one of said plurality of vias 124 to make electrical contact with at least one contact 118. The plurality of conductive traces 126 may be made of any applicable conductive material, such as copper, aluminum, and alloys thereof.

The plurality of conductive traces 126 may be formed by any known, technique, including but not limited to semi-additive plating and photolithographic techniques. An exemplary semi-additive plating technique can involve depositing a seed layer, such as sputter-deposited or electroless-deposited metal on the first dielectric layer 122. A resist layer is then patterned on the seed layer, such as a titanium/copper alloy, followed by electrolytic plating of a layer of metal, such as copper, on the seed layer exposed by open areas in the patterned resist layer. The patterned resist layer is stripped and portions of the seed layer not having the layer of metal plated thereon is etched away. Other methods of forming the plurality of conductive traces 126 will be apparent to those skilled in the art.

Figure 16:
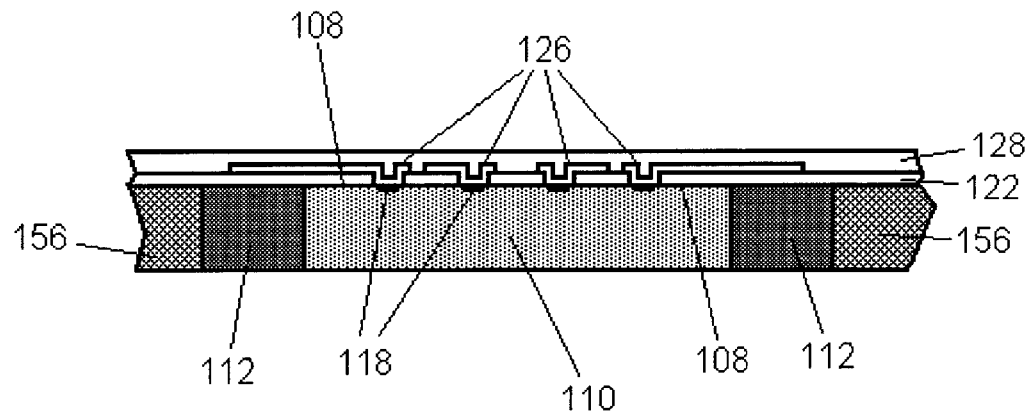

As shown in FIG. 16, a second dielectric layer 128 is disposed over the plurality of conductive traces 126 and the first dielectric layer 122. The formation of the second dielectric layer 128 may be achieved by any known process, including but not limited to film lamination, spin coating, roll coating and spray-on deposition.

Figure 17:
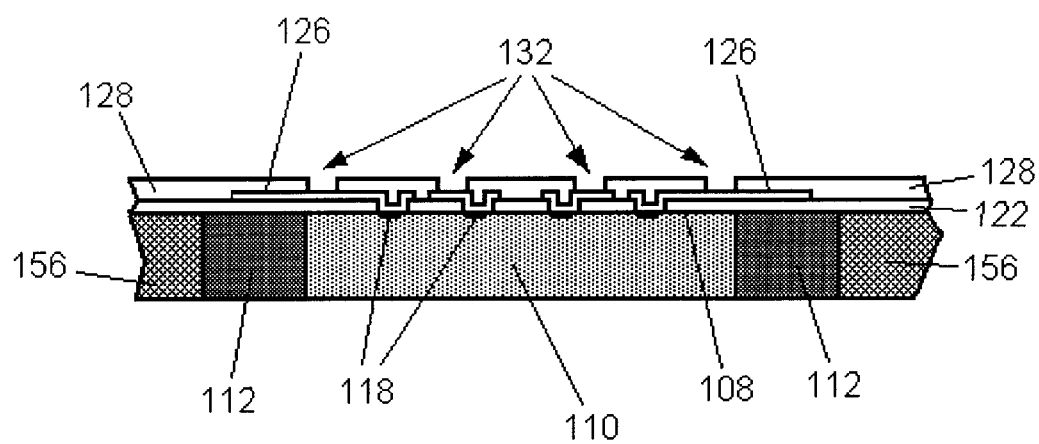

As shown in FIG. 17, a plurality of second vias 132 are then formed through the second dielectric layer 128. The plurality of second vias 132 may be formed any method known in the art, including but not limited to laser drilling and, if the second dielectric layer 128 is photoactive, forming the plurality of second vias 132 in the same manner that a photoresist mask is made in a photolithographic process, as known in the art.

If the plurality of conductive traces 126 is not capable of placing the plurality of second vias 132 in an appropriate position, then other portions of the conductive traces are formed in the plurality of second vias 132 and on the second dielectric layer 128, another dielectric layer formed thereon, and another plurality of vias is formed in the dielectric layer, such as described in FIGS. 15–17. The layering of dielectric layers and the formation of conductive traces can be repeated until the vias are in an appropriate position. Thus, portions of a single conductive trace be formed from multiple portions thereof and can reside on different dielectric layers. Currently, it is believed that to logic application there will be about 3 to 4 conductive trace layers.

Figure 18:
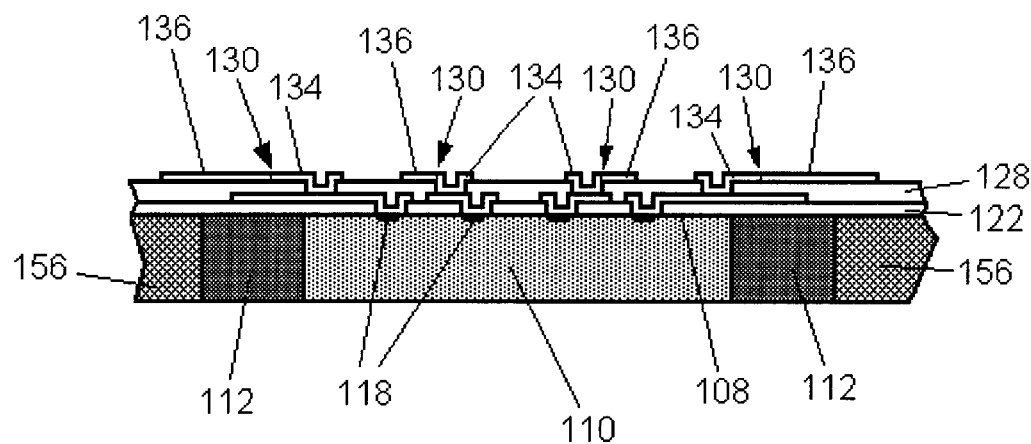

A second plurality of conductive traces 134 may be formed, wherein a portion of each of the second plurality of conductive traces 134 extends into at least one of said plurality of second vias 128. The second plurality of conductive traces 134 each include a landing pad 136 (an enlarged area on the traces demarcated by a line 130), as shown in FIG. 18.

Figure 19:
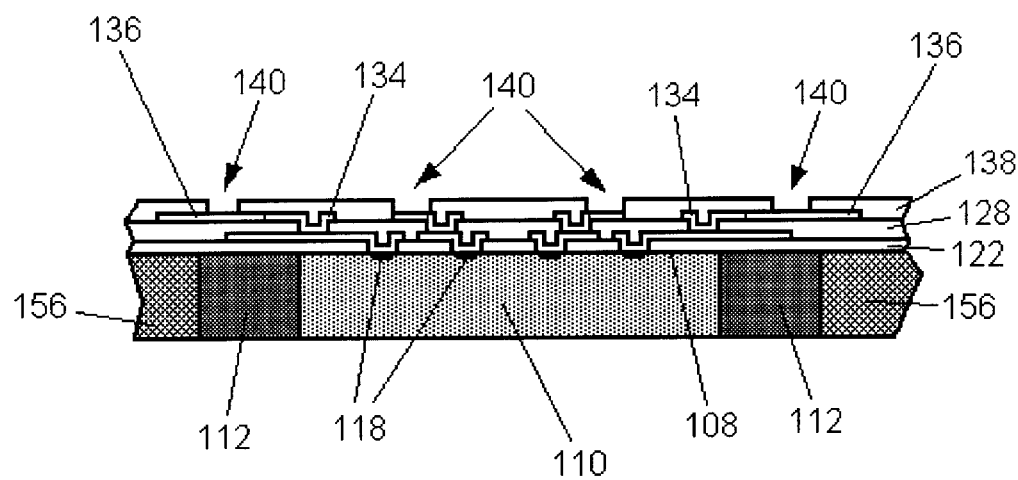
Figure 20:
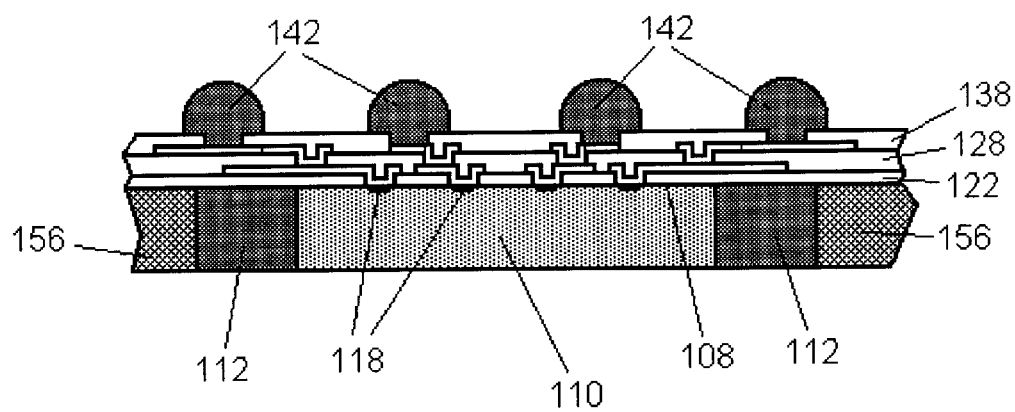

Once the second plurality of conductive traces 134 and landing pads 136 are formed, they can be used in the formation of conductive interconnects, such as solder bumps, solder balls, pins, and the like, for communication with external components (not shown). For example, a solder mask material 138 can be disposed over the second dielectric layer 128 and the second plurality of conductive traces 132 and landing pads 136. A plurality of vias 140 is then formed in the solder mask material 138 to expose at least a portion of each of the landing pads 136, as shown in FIG. 19. A plurality of conductive bumps 142, such as solder bumps, can be formed, such as by screen printing solder paste followed by a reflow process or by known plating techniques, on the exposed portion of each of the plurality of landing pads 136, as shown in FIG. 20.

Figure 21:
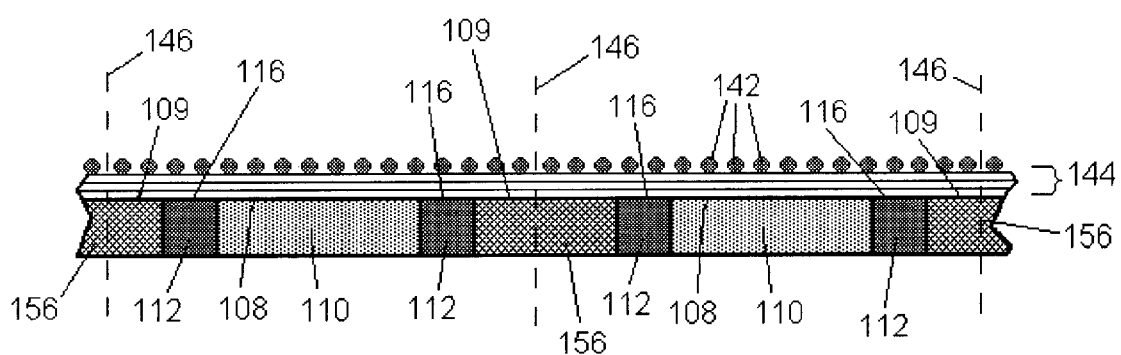
FIG. 21 is a side cross-sectional view of a microelectronic package, according to the present invention.
Figure 22:
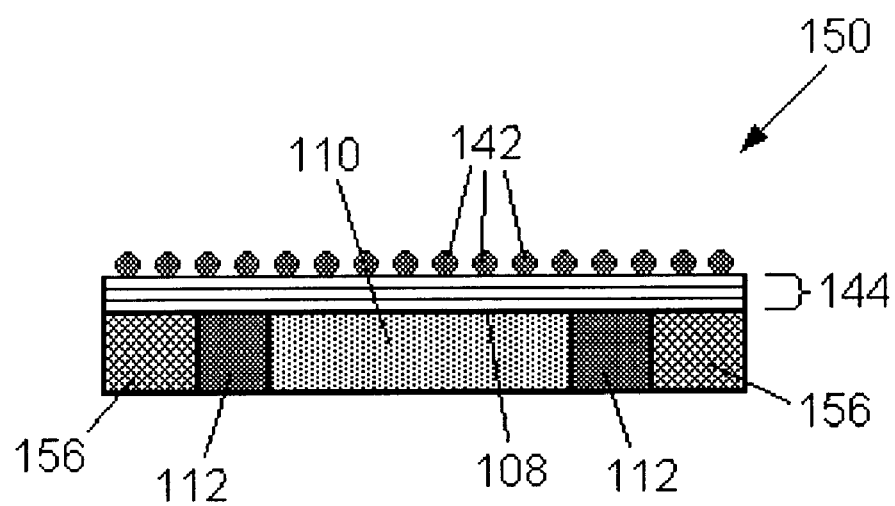
FIG. 22 is a side cross-sectional view of a singulated microelectronic die from the microelectronic package of FIG. 21, according to the present invention.

FIG. 21 illustrates a plurality of microelectronic dice 110 and a microelectronic package core 156 encapsulated with encapsulation material 112. At least one build-up layer is formed on the microelectronic dice active surfaces 108, the encapsulation material surface 116, and the microelectronic package core surface 109 in the manner previously discussed. The layer(s) of dielectric material and conductive traces comprising the build-up layer is simply designated together as build-up layer 144 in FIG. 21. The individual microelectronic dice 110 are then singulated along lines 146 (cut) through the build-up layer 144 and the microelectronic package core 156 to form at least one singulated microelectronic die package 150, as shown in FIG. 22.

Figure 23:
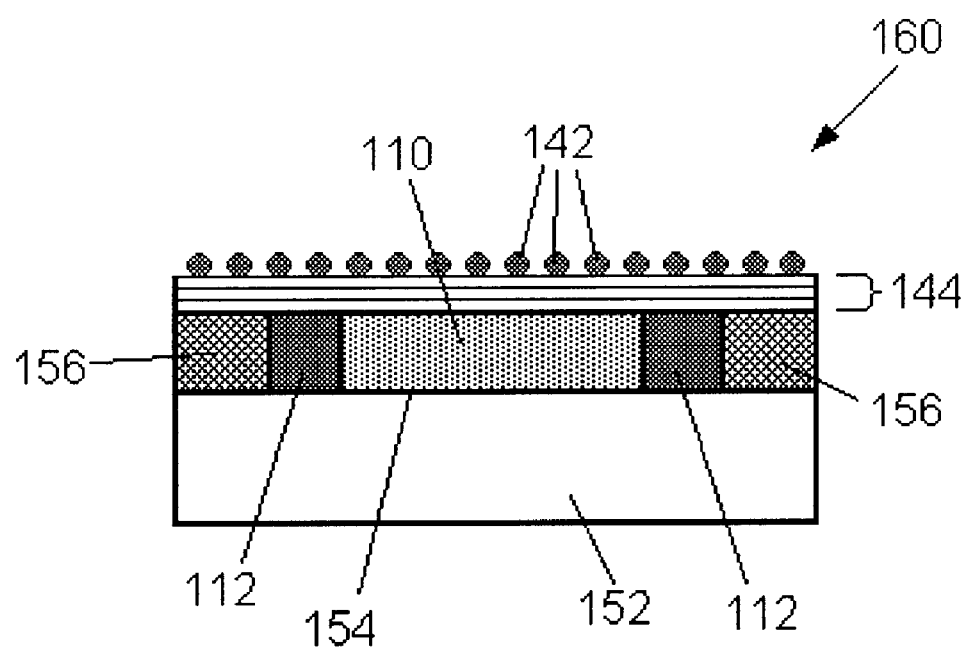
FIG. 23 is a side cross-sectional view of a microelectronic package having a heat sink attached thereto, according to the present invention.

FIG. 23 illustrates an embodiment 160 of the present invention that incorporates a heat dissipation device. A thermally conductive, heat dissipation device, such as heat slug 152 may be attached to a microelectronic die back surface 154, preferably with a thermally conductive adhesive or thermally conductive solder (not shown). The heat slug 152 should have a CTE (coefficient of thermal expansion) close to that of the microelectronic die 110 to reduce thermal stresses. For example, for a microelectronic die 110 formed of a silicon material, thermally conductive materials, such as molybdenum, and aluminum/silicon/carbon compounds would closely match the CTE of the silicon material.

Figure 24:
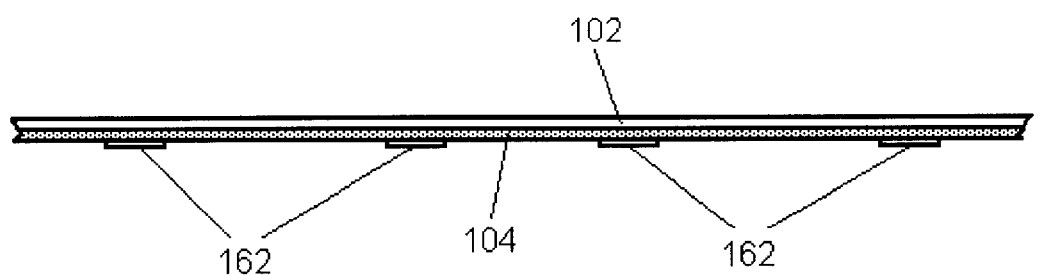
FIG. 24 is a side cross-sectional view of an alternate embodiment of the present invention utilizing a release layer on an adhesive material of a protective sheet.

In another embodiment of the current invention is illustrated in FIG. 24. The adhesive material 104 may be deposited over the surface of the protective film sheet 102 and a release layer 162 may patterned on top of the adhesive only in areas where the encapsulation material will be applied. The release layer 162 effectively diminishes the adhesive properties of the adhesive material 104. It is understood that the term "diminishes" or "diminish" includes from a lessening of the adhesive properties to complete elimination thereof.

The release layer 162 may be, but is not limited to, a liquid, such as carnauba wax (typically used as a molding release agent). The release layer 162 may be patterned by spray deposition, stenciling or other known techniques. Furthermore, the release layer 162 may be another protective film sheet cut to the proper shape and laid on top of the adhesive material (substantially surrounding the microelectronic die 110). The release layer 162 needs to be thin enough (preferably no greater than about 20 $\mu$m) such that the microelectronic dice active surfaces 108, the encapsulation material surface 116, and the microelectronic package core surface 109 (if a microelectronic package core 156 is used) surfaces are substantially planar (see FIGS. 6 and 11).

Figure 25A:
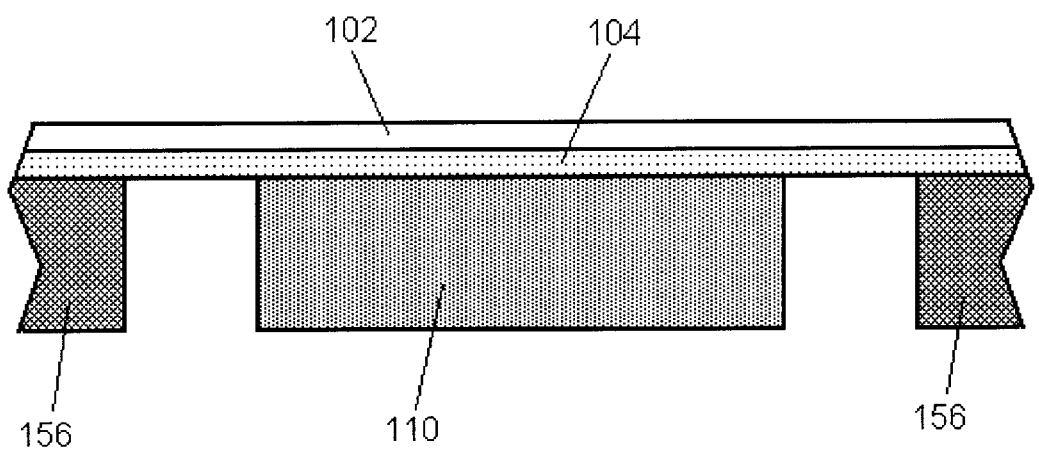
FIGS. 25a–c are side cross-sectional views of other alternate embodiments of the present invention wherein adhesive properties of an adhesive material on a protective sheet is diminished or eliminated, according to the present invention.
Figure 25B:
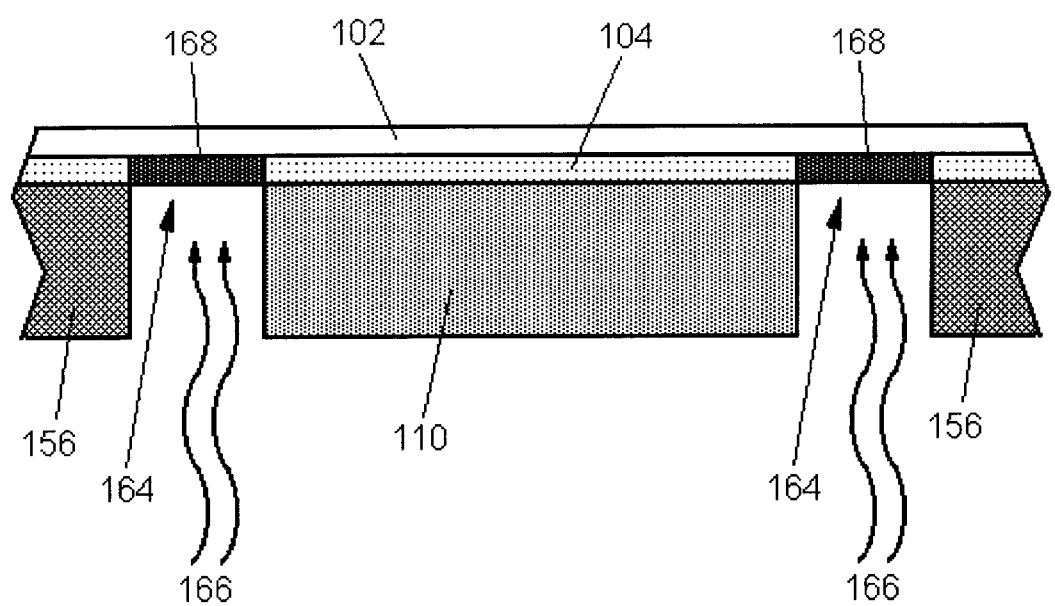
Figure 25C:
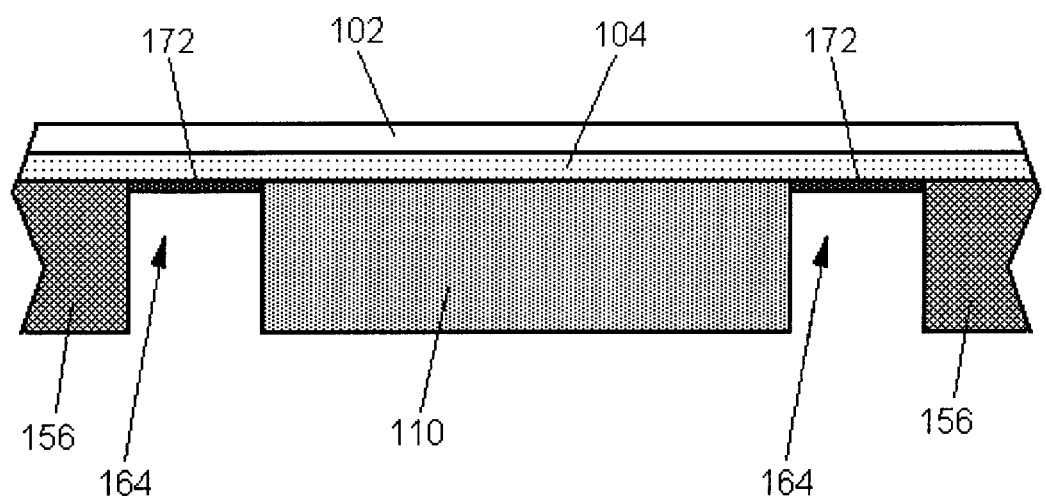
Figure 26:
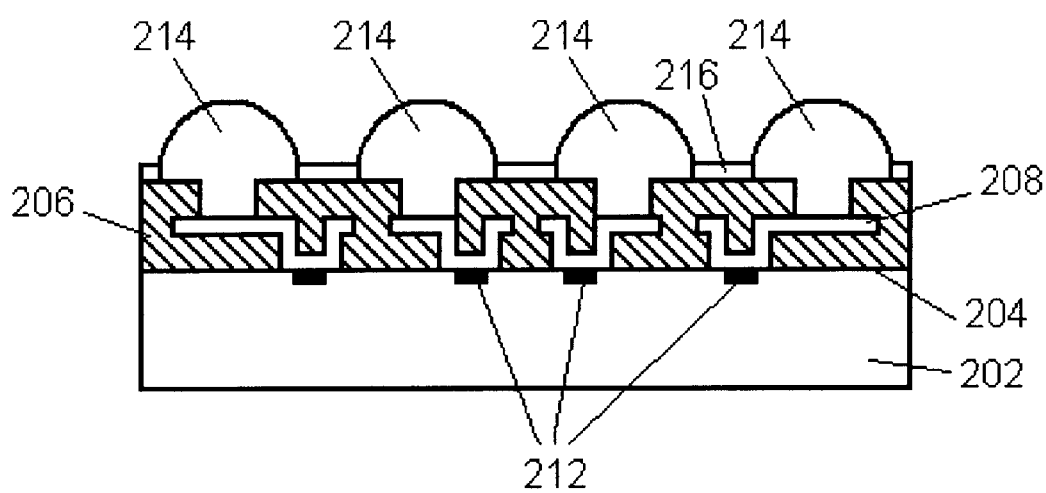
FIG. 26 is a side cross-sectional view of a true CSP of a microelectronic device, as known in the art.
Figure 27:
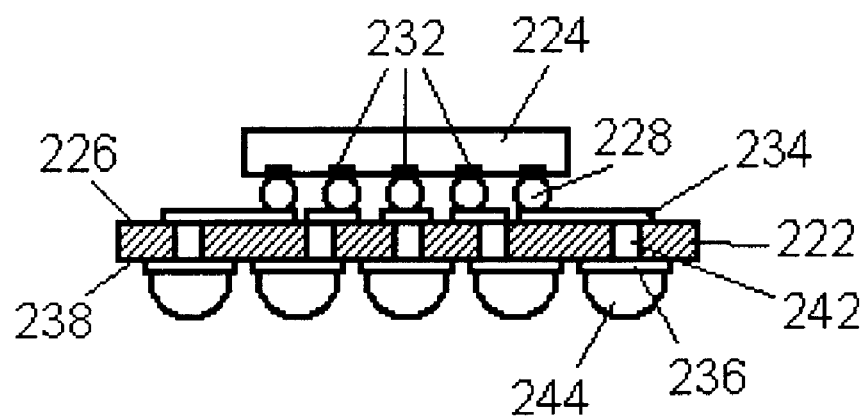
FIG. 27 is a cross-sectional view of a CSP of a microelectronic device utilizing a substrate interposer, as known in the art.
Figure 28:
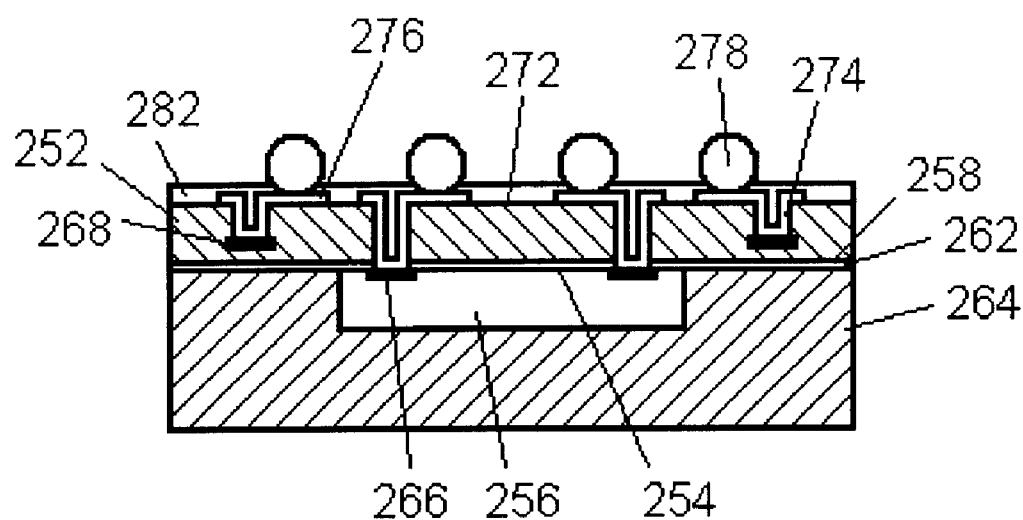
FIG. 28 is a cross-sectional view of a CSP of a microelectronic device utilizing a flex component interposer, as known in the art.

In another embodiment of the present invention, the microelectronic dice 110 and microelectronic package core 156 (optional) could be attached to a protective film sheet 102 which is completely covered on one surface with an adhesive material 104, as shown in FIG. 25a. Then, the microelectronic dice and microelectronic package core 156 are used as a masking layer for a process to diminish the adhesive properties of the adhesive material 104. For example, the exposed portion 164 of the adhesive material 104 may be irradiated with ultraviolet light 166. This increases the cross-linking of the polymer matrix in the adhesive material 104, which forms a decreased adhesion region 168 in the adhesive material 104, as shown in FIG. 25b. Furthermore, the adhesive material exposed portions 164 may be treated with a wetting agent, such as HMDS (hexamethyldisilazane), or a surfactant. This would form a monolayer coating 172 on the adhesive material exposed portions 164, which diminishes adhesion, as shown in FIG. 25c. The embodiments illustrated in FIGS. 25a–c have the advantage of being self-aligned, eliminating the need for precise patterning of the adhesive material 104, particularly as related to the corner-wetting issue.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A method of fabricating a microelectronic package, comprising:

providing a protective film including a protective film sheet having a first surface with at least one discrete adhesive material area patterned on said protective film sheet first surface;

abutting an active surface of at least one microelectronic die against said at least one discrete adhesive material area, said at least one adhesive material area corresponding substantially in size to the microelectronic die active surface; and encapsulating said at least one microelectronic die with an encapsulation material, wherein said encapsulation material provides at least one surface of said encapsulation material substantially planar to said microelectronic die active surface.

2. The method of claim 1, further including:

removing said protective film; and forming at least one build-up layer on said microelectronic die active surface.

3. The method of claim 2, where said forming at least one build-up layer comprising:

forming at least one dielectric material layer on at least a portion of said microelectronic die active surface and said encapsulation material surface;

forming a via through said at least one dielectric material layer to expose a portion of said microelectronic die active surface; and forming at least one conductive trace on said at least one dielectric material layer which extends into said via to electrically contact said microelectronic die active surface.

4. A method of fabricating a microelectronic package, comprising:

providing a protective film including a protective film sheet having a first surface with at least one discrete first adhesive material area and a second adhesive area patterned on said protective film sheet first surface;

abutting an active surface of said at least one microelectronic die against said at least one first discrete adhesive material area;

abutting a microelectronic package core against said second adhesive area; and disposing an encapsulation material between said at least one microelectronic die and said microelectronic package core, wherein said encapsulation material and said microelectronic package core provides a surface substantially planar to said microelectronic die active surface.

5. The method of claim 4, further including:

removing said protective film; and forming at least one build-up layer on said microelectronic die active surface.

6. The method of claim 5, where said forming at least one build-up layer comprising:

forming at least one dielectric material layer on at least a portion of said microelectronic die active surface and said encapsulation material surface;

forming a via through said at least one dielectric material layer to expose a portion of said microelectronic die active surface; and forming at least one conductive trace on said at least one dielectric material layer which extends into said via to electrically contact said microelectronic die active surface.

7. A method of fabricating a microelectronic package, comprising:

providing a protective film including a protective film sheet having a first surface with an adhesive material distributed across said protective film sheet first surface;

abutting an active surface of at least one microelectronic die against said adhesive material;

diminishing adhesive properties of the adhesive material in portions thereof not covered by said active surface of said at least one microelectronic die; and encapsulating said at least one microelectronic die with an encapsulation material, wherein said encapsulation material provides at least one surface of said encapsulation material substantially planar to said microelectronic die active surface.

8. The method of claim 7, further including:

removing said protective film; and forming at least one build-up layer on said microelectronic die active surface.

9. The method of claim 8, where said forming at least one build-up layer comprising:

forming at least one dielectric material layer on at least a portion of said microelectronic die active surface and said encapsulation material surface;

forming a via through said at least one dielectric material layer to expose a portion of said microelectronic die active surface; and forming at least one conductive trace on said at least one dielectric material layer which extends into said via to electrically contact said microelectronic die active surface.

10. The method of claim 7, wherein diminishing adhesive properties of the adhesive material comprises disposing a release layer on said adhesive material in portions thereof not covered nor to be covered by said active surface of said at least one microelectronic die.

11. The method of claim 10, wherein disposing a release layer comprises disposing carnauba wax on said adhesive material in portions thereof not covered nor to be covered by said active surface of said at least one microelectronic die.

12. The method of claim 10, wherein disposing a release layer comprises disposing a patterned protective sheet on said adhesive material in portions thereof not covered nor to be covered by said active surface of said at least one microelectronic die.

13. The method of claim 7, wherein diminishing adhesive properties of the adhesive material comprises exposing said adhesive material in portions thereof not covered nor to be covered by said active surface of said at least one microelectronic die to ultraviolet radiation.

14. The method of claim 7, wherein diminishing adhesive properties of the adhesive material comprises disposing a wetting agent on said adhesive material in portions thereof not covered nor to be covered by said active surface of said at least one microelectronic die.

15. The method of claim 7, wherein diminishing adhesive properties of the adhesive material comprises disposing a surfactant on said adhesive material in portions thereof not covered nor to be covered by said active surface of said at least one microelectronic die.

16. A method of fabricating a microelectronic package, comprising:

providing a protective film including a protective film sheet having a first surface with at least one discrete first adhesive material area and a second adhesive area patterned on said protective film sheet first surface;

abutting an active surface of said at least one microelectronic die against said at least one first discrete adhesive material area;

abutting a microelectronic package core against said second adhesive area;

diminishing adhesive properties of the adhesive material in portions thereof not covered by said active surface of said at least one microelectronic die; and disposing an encapsulation material between said at least one microelectronic die and said microelectronic package core, wherein said encapsulation material and said microelectronic package core provides a surface substantially planar to said microelectronic die active surface.

17. The method of claim 16, further including:

removing said protective film; and forming at least one build-up layer on said microelectronic die active surface.

18. The method of claim 17, where said forming at least one build-up layer comprising:

forming at least one dielectric material layer on at least a portion of said microelectronic die active surface and said encapsulation material surface;

forming a via through said at least one dielectric material layer to expose a portion of said microelectronic die active surface; and forming at least one conductive trace on said at least one dielectric material layer which extends into said via to electrically contact said microelectronic die active surface.

19. The method of claim 16, wherein diminishing adhesive properties of the adhesive material comprises disposing a release layer on said adhesive material in portions thereof not covered nor to be covered by said active surface of said at least one microelectronic die.

20. The method of claim 19, wherein disposing a release layer comprises disposing carnauba wax on said adhesive material in portions thereof not covered nor to be covered by said active surface of said at least one microelectronic die.

21. The method of claim 19, wherein disposing a release layer comprises disposing a patterned protective sheet on said adhesive material in portions thereof not covered nor to be covered by said active surface of said at least one microelectronic die.

22. The method of claim 19, wherein diminishing adhesive properties of the adhesive material comprises exposing said adhesive material in portions thereof not covered nor to be covered by said active surface of said at least one microelectronic die to ultraviolet radiation.

23. The method of claim 16, wherein diminishing adhesive properties of the adhesive material comprises disposing a wetting agent on said adhesive material in portions thereof not covered nor to be covered by said active surface of said at least one microelectronic die.

24. The method of claim 16, wherein diminishing adhesive properties of the adhesive material comprises disposing a surfactant on said adhesive material in portions thereof not covered nor to be covered by said active surface of said at least one microelectronic die.

* * * * *